United States Patent
Kishino (10) Patent No.: US 11,682,691 B2
(45) Date of Patent: Jun. 20, 2023

(54) LIGHT-EMITTING DEVICE

(71) Applicant: NICHIA CORPORATION, Anan (JP)

(72) Inventor: Toshihiko Kishino, Anan (JP)

(73) Assignee: NICHIA CORPORATION, Anan (JP)

(*) Notice: Subject to any disclaimer, the term of this patent is extended or adjusted under 35 U.S.C. 154(b) by 9 days.

(21) Appl. No.: 17/534,010

(22) Filed: Nov. 23, 2021

(65) Prior Publication Data

US 2022/0085096 A1    Mar. 17, 2022

Related U.S. Application Data (62) Division of application No. 16/927,399, filed on Jul. 13, 2020, now Pat. No. 11,217,622.

(30) Foreign Application Priority Data

Jul. 19, 2019 (JP) ................ JP2019-133545

(51) Int. Cl.
*H01L 27/15* (2006.01)
*H01L 33/00* (2010.01)
(Continued)

(52) U.S. Cl.
CPC .......... *H01L 27/15* (2013.01); *H01L 33/0062* (2013.01); *H01L 33/0075* (2013.01);
(Continued)

(58) Field of Classification Search
CPC . H01L 27/15; H01L 33/0062; H01L 33/0075; H01L 33/44; H01L 21/02458; H01L 2933/0025
See application file for complete search history.

(56) References Cited

U.S. PATENT DOCUMENTS 6,242,761 B1   6/2001   Fujimoto et al.
6,528,337 B1   3/2003   Arakawa et al.
(Continued)

FOREIGN PATENT DOCUMENTS

| JP | H09-162444 A | 6/1997 |
| JP | H10-256605 A | 9/1998 |

(Continued)

OTHER PUBLICATIONS

U.S. Notice of Allowance issued in U.S. Appl. No. 16/927,399 dated Sep. 21, 2021.

*Primary Examiner* — Robert G Bachner
(74) *Attorney, Agent, or Firm* — Foley & Lardner LLP (57) ABSTRACT

A light-emitting device includes: a first light-emitting element portion including: an n-side nitride semiconductor layer, a first light-emitting layer over the n-side nitride semiconductor layer, and a first p-side nitride semiconductor layer over the first light-emitting layer; a second light-emitting element portion including: a second light-emitting layer over the n-side nitride semiconductor layer, and a second p-side nitride semiconductor layer over the second light-emitting layer; an n-side electrode connected to the n-side nitride semiconductor layer; a first p-side electrode disposed over the first p-side nitride semiconductor layer via an upper n-type semiconductor layer; and a second p-side electrode connected to the second p-side nitride semiconductor layer. The first p-side nitride semiconductor layer and the upper n-type semiconductor layer form a tunnel junction.

15 Claims, 8 Drawing Sheets

(51) Int. Cl.
*H01L 33/44* (2010.01)
*H01L 21/02* (2006.01)
(52) U.S. Cl.
CPC ........ *H01L 33/44* (2013.01); *H01L 21/02458* (2013.01); *H01L 2933/0025* (2013.01)

(56) References Cited

U.S. PATENT DOCUMENTS

| | | |
|---|---|---|
| 2001/0006527 A1 | 7/2001 | Inoue et al. |
| 2003/0197204 A1 | 10/2003 | Miyazaki et al. |
| 2008/0116477 A1 | 5/2008 | Komada |
| 2008/0217646 A1 | 9/2008 | Komada |
| 2009/0180508 A1 | 7/2009 | Makita et al. |
| 2011/0240955 A1 | 10/2011 | Windisch et al. |
| 2016/0197232 A1 | 7/2016 | Bour et al. |
| 2016/0315218 A1 | 10/2016 | Bour et al. |
| 2017/0170360 A1 | 6/2017 | Bour et al. |
| 2017/0338373 A1 | 11/2017 | Wildeson et al. |
| 2018/0097145 A1 | 4/2018 | Bour et al. |
| 2019/0115495 A1 | 4/2019 | Bour et al. |
| 2019/0371964 A1 | 12/2019 | Bour et al. |

FOREIGN PATENT DOCUMENTS

| | | |
|---|---|---|
| JP | H10-294531 A | 11/1998 |
| JP | H10-321957 A | 12/1998 |
| JP | 2000-353862 A | 12/2000 |
| JP | 2001-284728 A | 10/2001 |
| JP | 2002-009335 A | 1/2002 |
| JP | 2002-319703 A | 10/2002 |
| JP | 2003-309328 A | 10/2003 |
| JP | 2006-351784 A | 12/2006 |
| JP | 2008-130878 A | 6/2008 |
| JP | 2008-226906 A | 9/2008 |
| JP | 2009-188372 A | 8/2009 |
| JP | 2010-505251 A | 2/2010 |
| JP | 2012-104766 A | 5/2012 |
| JP | 2013-191627 A | 9/2013 |
| JP | 2015-026731 A | 2/2015 |
| JP | 2018-006502 A | 1/2018 |
| JP | 2018-505567 A | 2/2018 |
| JP | 2019-106494 A | 6/2019 |
| JP | 2019-517144 A | 6/2019 |
| WO | WO-2018/081635 A1 | 5/2018 |

LIGHT-EMITTING DEVICE

CROSS-REFERENCE TO RELATED APPLICATION

This application is a divisional of U.S. patent application Ser. No. 16/927,399, filed on Jul. 13, 2020, which claims priority to Japanese Patent Application No. 2019-133545, filed on Jul. 19, 2019, the disclosures of which are hereby incorporated by reference in their entireties.

BACKGROUND

The present disclosure relates to a method of manufacturing a light-emitting device and to a light-emitting device. Semiconductor light-emitting elements each of which can emit light having two or more colors are increasingly being demanded in recent years. For example, Japanese Patent Publication No. H10-256605 discloses a semiconductor light-emitting element in which a first light emitting portion (hereinafter referred to as a first light-emitting element portion) and a second light emitting portion (hereinafter referred to as a second light-emitting element portion) with different emission colors are formed on a single semiconductor substrate. Paragraph [0023] in Japanese Patent Publication No. H10-256605 states that "instead of further laminating a semiconductor layer for two or more light emitting portions on the semiconductor layer for the first light emitting portion, the light emitting portions may be separately formed by selective growth on respective portions of the semiconductor substrate."

SUMMARY

However, in the case in which the semiconductor layer for the second light-emitting element portion is to be grown after the semiconductor layer for the first light-emitting element portion is grown, the first light-emitting element portion that has been formed earlier is exposed to high temperatures again, and the first light-emitting element portion may be deteriorated. The first light-emitting element portion can be exposed to high temperatures again, not only in the growing process of the semiconductor layer for the second light-emitting element portion.

An object of the present disclosure is therefore to provide a method of manufacturing a light-emitting device in which deterioration of a light-emitting element portion can be reduced even in the case in which the light-emitting element portion is exposed to high temperatures after being formed.

According to one embodiment in the present disclosure, a method of manufacturing a light-emitting device includes: growing a layered structure on a substrate, the layered structure comprising an n-side nitride semiconductor layer, a first light-emitting layer, and a first p-side nitride semiconductor layer; growing an upper n-type semiconductor layer over the first p-side nitride semiconductor layer; forming a protective film over the upper n-type semiconductor layer, the protective film containing an element functioning as an n-type impurity for the upper n-type semiconductor layer; heating at least the upper n-type semiconductor layer and the protective film; at least partially removing the protective film to expose a surface of the upper n-type semiconductor layer; and forming a first p-side electrode on the exposed surface of the upper n-type semiconductor layer.

According to another embodiment in the present disclosure, a light-emitting device includes: a first light-emitting element portion including an n-side nitride semiconductor layer, a first light-emitting layer over the n-side nitride semiconductor layer, and a first p-side nitride semiconductor layer over the light-emitting layer; a second light-emitting element portion including a second light-emitting layer over the n-side nitride semiconductor layer and a second p-side nitride semiconductor layer over the second light-emitting layer; an n-side electrode connected to the n-side nitride semiconductor layer; a first p-side electrode disposed over the first p-side nitride semiconductor layer via an upper n-type semiconductor layer; and a second p-side electrode connected to the second p-side nitride semiconductor layer. The first p-side nitride semiconductor layer and the upper n-type semiconductor layer form a tunnel junction.

According to certain embodiments of the method of manufacturing a light-emitting device described herein, deterioration of the first light-emitting element portion can be reduced even in the case in which the first light-emitting element portion is exposed to high temperatures in the subsequent heating step. Further, according to another embodiment, a light-emitting device including the first light-emitting element portion and the second light-emitting element portion can be provided.

DETAILED DESCRIPTION

As described above, in the case in which the semiconductor layer for the second light-emitting element portion is to be grown after the semiconductor layer for the first light-emitting element portion is grown, the semiconductor layer for the first light-emitting element portion that has been grown earlier is exposed to high temperatures again, and the semiconductor layer for the first light-emitting element portion may be deteriorated.

For example, in the case in which a protective film made of $SiO_2$ or the like is formed over a nitride semiconductor layer of the first light-emitting element portion including a p-type nitride semiconductor layer as the uppermost layer before the nitride semiconductor layer of the second light-emitting element portion is grown, the p-type electrical conductivity of the p-type nitride semiconductor layer that has been grown earlier is reduced. The reason the p-type electrical conductivity of the p-type nitride semiconductor layer is reduced is deemed to be diffusion of Si, which is an n-type impurity for the nitride semiconductor layer, into the p-type nitride semiconductor layer due to exposure of the protective film and the p-type nitride semiconductor layer for the first light-emitting element portion to high temperatures. However, the protective film made of $SiO_2$ or the like is useful for, for example, effectively inhibiting growth of a nitride semiconductor layer on the nitride semiconductor layer for the first light-emitting element portion when the nitride semiconductor layer for the second light-emitting element portion is grown. The present inventor has therefore investigated a method and constitution for reducing diffusion of Si, which is an n-type impurity, into the p-type nitride semiconductor layer even in the case in which the protective film, which is made of $SiO_2$ or the like and formed over the p-type nitride semiconductor layer, and the p-type nitride semiconductor layer of the first light-emitting element portion are exposed to high temperatures. As a result, it has been found that diffusion of Si into the p-type nitride semiconductor layer can be reduced even in the case in which the protective film and the p-type nitride semiconductor layer are exposed to high temperatures by forming the protective film made of $SiO_2$ or the like over the p-side nitride semiconductor layer with an upper n-type semiconductor layer therebetween. In addition, it has been confirmed that a p-side electrode, which is generally formed on the p-type nitride semiconductor layer, can be electrically connected to the p-type nitride semiconductor layer by a tunnel junction between the p-side nitride semiconductor layer and the upper n-type semiconductor layer.

The light-emitting device and the method of manufacturing a light-emitting device according to certain embodiments in the present disclosure have been made on the basis of the above findings. The light-emitting device of the embodiment includes the p-side electrode disposed on the p-side nitride semiconductor layer with the upper n-type semiconductor layer forming a tunnel junction with the p-side nitride semiconductor layer therebetween.

The method of manufacturing a light-emitting device of certain embodiments includes a step that requires heating, such as a regrowth step, after the protective film made of $SiO_2$ or the like is formed on the p-side nitride semiconductor layer with the n-type semiconductor layer forming a tunnel junction with the p-side nitride semiconductor layer therebetween.

The light-emitting device and the method of manufacturing a light-emitting device according to certain embodiments in the present disclosure will be described referring to specific examples.

Light-Emitting Device

Figure 1A:
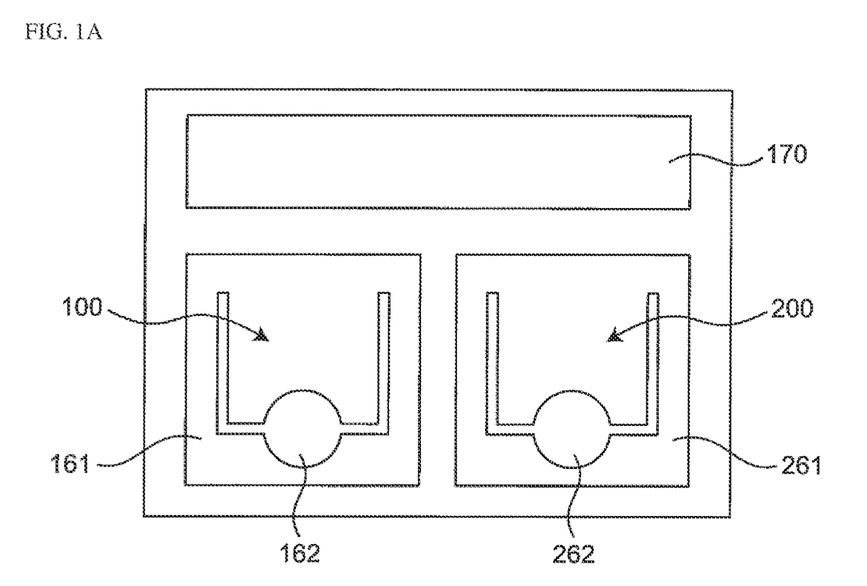
FIG. 1A is a schematic top view of a light-emitting device according to an embodiment in the present disclosure.
Figure 1B:
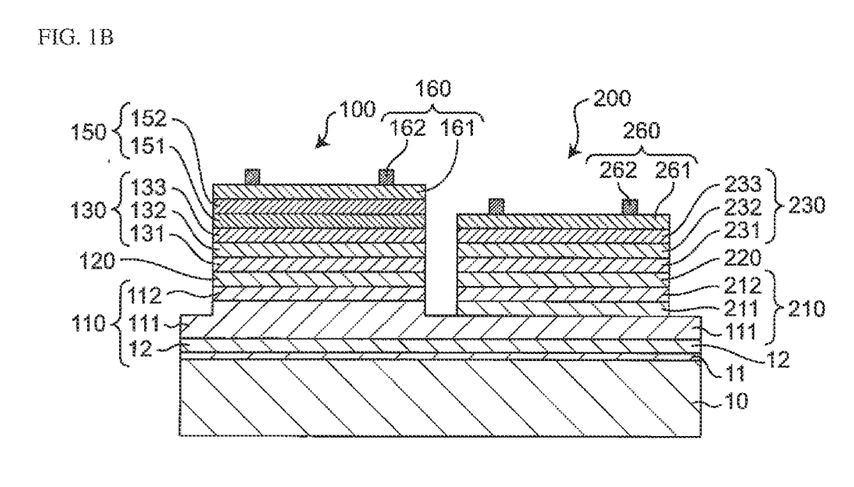
FIG. 1B is a schematic cross-sectional view of the light-emitting device according to the embodiment in the present disclosure.

The light-emitting device of the embodiment includes a first light-emitting element portion 100 and a second light-emitting element portion 200 on a single substrate 10 as shown in FIG. 1A and FIG. 1B. In the light-emitting device of the embodiment, the first light-emitting element portion 100 and the second light-emitting element portion 200 are formed on the substrate 10 and share a single lower n-type semiconductor layer (Si-doped GaN layer 111), and a shared n-side electrode 170 is disposed on the Si-doped GaN layer 111. The first light-emitting element portion 100 includes a first n-side nitride semiconductor layer 110 containing the Si-doped GaN layer 111, a first light-emitting layer 120 on the first n-side nitride semiconductor layer 110, and a first p-side nitride semiconductor layer 130 on the first light-emitting layer 120. The second light-emitting element portion 200 includes a second light-emitting layer 220 on the first n-side nitride semiconductor layer 110 and a second p-side nitride semiconductor layer 230 on the second light-emitting layer 220. The first light-emitting layer 120 differs from the second light-emitting layer 220 in composition, and first light emitted from the first light-emitting element portion 100 differs from second light emitted from the second light-emitting element portion 200 in peak wavelength. A first p-side electrode 160 is disposed on the first p-side nitride semiconductor layer 130 with an upper n-type semiconductor layer 150 therebetween, and a second p-side electrode 260 is disposed on the second p-side nitride semiconductor layer 230 in contact with the second p-side nitride semiconductor layer 230. The first p-side nitride semiconductor layer 130 and the upper n-type semiconductor layer 150 form a tunnel junction.

The structures of the first light-emitting element portion 100 and the second light-emitting element portion 200 will be described in more detail referring to FIG. 1B. Specific examples below are merely examples and are not intended to limit the present invention. The composition and thickness of each semiconductor layer described below are examples in the case in which the first light-emitting element portion 100 emits blue first light and in which the second light-emitting element portion 200 emits green second light, and these examples are not intended to limit the present invention.

For example, the first light-emitting element portion 100 and the second light-emitting element portion 200 are formed on the substrate 10 with a buffer layer 11 therebetween. The substrate 10 is, for example, a sapphire substrate having a plurality of projections on a surface on which the first light-emitting element portion 100 and the second light-emitting element portion 200 are to be formed, and the buffer layer 11 is, for example, an AlGaN layer grown to a thickness of 20 nm.

The first n-side nitride semiconductor layer 110 of the first light-emitting element portion 100 includes a non-doped GaN layer 12, the Si-doped GaN layer 111, and a superlattice layer 112. For example, the non-doped GaN layer 12 is grown to a thickness of 3.5 μm without doping. The non-doped GaN layer 12 is shared between the first light-emitting element portion 100 and the second light-emitting element portion 200. The Si-doped GaN layer 111, which is the lower n-type semiconductor layer, is also shared between the first light-emitting element portion 100 and the second light-emitting element portion 200 as described above. The Si-doped GaN layer 111 constitutes a portion of the first n-side nitride semiconductor layer 110 in the first light-emitting element portion 100. The Si-doped GaN layer 111 is, for example, a GaN layer having a thickness of 7 μm and containing Si, which is an n-type impurity, at an impurity concentration of $5-7 \times 10^{18}/cm^3$. The first n-side nitride semiconductor layer 110 in the first light-emitting element portion 100 may contain other layers such as the superlattice layer 112. The superlattice layer 112 is made by alternately layering 20 pairs of non-doped GaN layers with a thickness of 2 nm and non-doped $In_{0.06}Ga_{0.94}N$ layers with a thickness of 1 nm.

In the first light-emitting element portion 100, the first light-emitting layer (active layer) 120 is disposed on the first n-side nitride semiconductor layer 110. The first light-emitting layer (active layer) 120 has, for example, a quantum well structure. The first light-emitting layer (active layer) 120 is made by, for example, alternately layering nine pairs of non-doped barrier layers with a thickness of 4.8 nm and non-doped well layers with a thickness of 3.5 nm. The barrier layers are made of, for example, GaN. The well layers are made of, for example, $In_{x1}Ga_{1-x1}N$, where x1 is, for example, 0.14 to 0.15.

In the first light-emitting element portion 100, the first p-side nitride semiconductor layer 130 is disposed on the first light-emitting layer (active layer) 120. The first p-side nitride semiconductor layer 130 includes, for example, a Mg-doped AlGaN layer 131, a non-doped GaN layer 132, and a Mg-doped GaN layer 133 from the first light-emitting layer (active layer) 120. The Mg-doped AlGaN layer 131 can function as an electron blocking layer. For example, the Mg-doped AlGaN layer 131 has a thickness of 10 nm and is made of p-type $Al_{0.17}Ga_{0.83}N$ doped with Mg. The non-doped GaN layer 132 can function as a carrier diffusion layer. For example, the non-doped GaN layer 132 has a thickness of 70 nm and is made of non-doped GaN. For example, the Mg-doped GaN layer 133 has a thickness of 20 nm and is made of p-type GaN doped with Mg.

The first light-emitting element portion 100 further includes the upper n-type semiconductor layer 150 between the first p-side nitride semiconductor layer 130 and a first light-transmissive electrode 161 described later. The first p-side nitride semiconductor layer 130 and the upper n-type semiconductor layer 150 form a tunnel junction. That is, a tunnel junction is formed between the first p-side nitride semiconductor layer 130 and the upper n-type semiconductor layer 150. For example, the upper n-type semiconductor layer 150 includes a Si-doped GaN layer 151 (first upper n-type semiconductor layer) disposed in contact with the Mg-doped GaN layer 133 of the first p-side nitride semiconductor layer 130 to form a tunnel junction with the Mg-doped GaN layer 133, and a Si-doped GaN layer 152 (second upper n-type semiconductor layer) disposed on the Si-doped GaN layer 151. For example, the Si-doped GaN layer 151 has a thickness of 30 nm and is made of n-type GaN doped with Si, which is an n-type impurity, at a comparatively high concentration of $8 \times 10^{19}$ to $8 \times 10^{20}/cm^3$. For example, the Si-doped GaN layer 152 has a thickness of 0.1 μm and is made of n-type GaN doped with Si, which is an n-type impurity, at a concentration of $5-7 \times 10^{18}/cm^3$ lower than the concentration in the Si-doped GaN layer 151.

In the first light-emitting element portion 100, the first p-side electrode 160 includes the first light-transmissive electrode 161 and a first pad electrode 162. For example, the first light-transmissive electrode 161 is made of a light-transmissive electrically conductive material such as ITO and has a thickness of 60 nm. For example, the first pad electrode 162 is made of metal and includes a Ti layer with a thickness of 1.5 nm, a Rh layer with a thickness of 200 nm, and a Au layer with a thickness of 500 nm from the first light-transmissive electrode 161. The electrode disposed on the surface of the upper n-type semiconductor layer 150 is referred to as the "first p-side electrode" for convenience, but the electrode may be referred to as a first anode electrode instead. In this case, the second p-side electrode is a first anode electrode, and the n-side electrode 170 is a cathode electrode.

For example, a second n-side nitride semiconductor layer 210 in the second light-emitting element portion 200 includes the non-doped GaN layer 12 and the Si-doped GaN layer 111. The second n-side nitride semiconductor layer 210 may further include other layers such as a Si-doped GaN layer 211 and a superlattice layer 212. For example, the Si-doped GaN layer 211 has the same composition as the Si-doped GaN layer 111 and has a thickness of 0.1 μm. For example, the superlattice layer 212 is made by alternately layering 30 pairs of non-doped GaN layers with a thickness of 3 nm and non-doped $In_{0.06}Ga_{0.94}N$ layers with a thickness of 1.5 nm.

In the second light-emitting element portion 200, the second light-emitting layer (active layer) 220 is disposed on the second n-side nitride semiconductor layer 210. The second light-emitting layer (active layer) 220 has, for example, a quantum well structure. The second light-emitting layer 220 is made by, for example, alternately layering nine pairs of barrier layers with a thickness of 15 nm and well layers with a thickness of 3 nm. The barrier layers are made of, for example, non-doped GaN. The well layers are made of, for example, non-doped $In_{x2}Ga_{1-x2}N$, where x2 is, for example, 0.19 to 0.20.

In the second light-emitting element portion 200, the second p-side nitride semiconductor layer 230 is disposed on the second light-emitting layer (active layer) 220. The second p-side nitride semiconductor layer 230 includes, for example, a Mg-doped AlGaN layer 231, a non-doped GaN layer 232, and a Mg-doped GaN layer 233 from the second light-emitting layer (active layer) 220 side. The Mg-doped AlGaN layer 231 can function as an electron blocking layer. For example, the Mg-doped AlGaN layer 231 has a thickness of 10 nm and is made of p-type $Al_{0.17}Ga_{0.83}N$ doped with Mg. The non-doped GaN layer 232 can function as a carrier diffusion layer. For example, the non-doped GaN layer 232 has a thickness of 70 nm and is made of non-doped GaN. For example, the Mg-doped GaN layer 233 has a thickness of 20 nm and is made of p-type GaN doped with Mg.

In the second light-emitting element portion 200, the second p-side electrode 260 includes a second light-transmissive electrode 261 and a second pad electrode 262. For example, the second light-transmissive electrode 261 is made of a light-transmissive electrically conductive film made of a material such as ITO and has a thickness of 60 nm. For example, the second pad electrode 262 is made of metal and includes a Ti layer with a thickness of 1.5 nm, a Rh layer with a thickness of 200 nm, and a Au layer with a thickness of 500 nm from the second light-transmissive electrode 261 side.

In the light-emitting device of the embodiment having the structure described above, light produced in the first light-emitting layer (active layer) 120 of the first light-emitting element portion 100 and light produced in the second light-emitting layer (active layer) 220 of the second light-emitting element portion 200 are respectively emitted from the side of the first p-side electrode 160 and the second p-side electrode 260.

Alternatively, the first p-side electrode 160 and the second p-side electrode 260 may have structures with high light reflectances to allow the light to be extracted from the substrate 10.

For example, the light-emitting device can have a rectangular shape of side about 20 to 3,000 µm in a top view. For example, the first light-emitting element portion 100 and the second light-emitting element portion 200 can each have a rectangular shape of side about 5 to 1,000 µm in a top view. The shapes and/or the sizes of the first light-emitting element portion 100 and the second light-emitting element portion 200 may be the same or different.

The method of manufacturing a light-emitting device according to the embodiment will be described below.

Method of Manufacturing Light-Emitting Device According to Embodiment

Figure 3A:
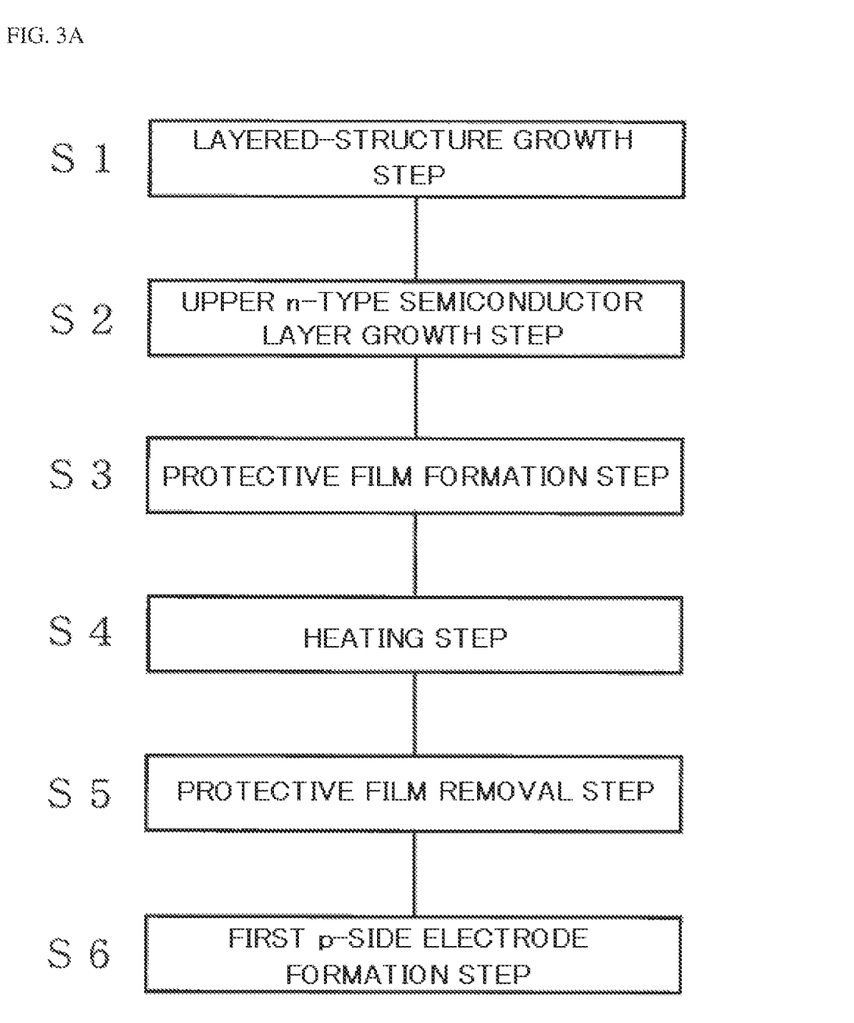
FIG. 3A is a flowchart of the method of manufacturing a light-emitting device according to the embodiment in the present disclosure.

According to one embodiment, a method of manufacturing a light-emitting device, which includes a first light-emitting element portion including a portion of an n-side nitride semiconductor layer, a first light-emitting layer, and a first p-side nitride semiconductor layer, includes at least the steps below, as shown in FIG. 3A:

(S1) a layered-structure growth step of growing, on a substrate, a layered structure including the n-side nitride semiconductor layer, the first light-emitting layer, and the first p-side nitride semiconductor layer;
(S2) an upper n-type semiconductor layer growth step of growing an upper n-type semiconductor layer over the first p-side nitride semiconductor layer;
(S3) a protective film formation step of forming, over the upper n-type semiconductor layer, a protective film containing an element functioning as an n-type impurity for the upper n-type semiconductor layer;
(S4) a heating step of heating at least the upper n-type semiconductor layer and the protective film;
(S5) a protective film removal step of at least partially removing the protective film to expose a surface of the upper n-type semiconductor layer; and
(S6) a first p-side electrode formation step of forming a first p-side electrode on the exposed surface of the upper n-type semiconductor layer.

In the layered-structure growth step, the semiconductor layered structure that constitutes part of the first light-emitting element portion and includes the n-side nitride semiconductor layer, the first light-emitting layer, and the first p-side nitride semiconductor layer is formed.

In the upper n-type semiconductor layer growth step, the upper n-type semiconductor layer, which has a function of reducing diffusion of the n-type impurity contained in the protective film into the first p-side nitride semiconductor layer when the protective film disposed on the first p-side nitride semiconductor layer of the semiconductor layered structure is heated, is grown.

In the protective film formation step, the protective film, which protects the first light-emitting element portion by, for example, inhibiting unnecessary growth of a nitride semiconductor layer on the first light-emitting element portion when an element portion other than the first light-emitting element portion, is formed on the same substrate is formed.

The heating step involves heating and includes not only an annealing step by heating but also a step inevitably involving heating, such as a step of growing a nitride semiconductor to constitute a second element portion other than the first light-emitting element portion.

In the protective film removal step, the surface of the upper n-type semiconductor layer is exposed by at least partially removing the protective film so that the first p-side electrode of the first light-emitting element portion can be formed.

In the first p-side electrode formation step, the first p-side electrode is formed on the exposed surface of the upper n-type semiconductor layer. For example, an electrode for an element portion other than the first light-emitting element portion may also be formed at the same time as the electrode connected to the first p-side nitride semiconductor layer.

The method of manufacturing a light-emitting device according to the embodiment described above includes the upper n-type semiconductor layer growth step and the protective film formation step after the layered-structure growth step, so that the method can include the heating step while inhibiting reduction in p-type electrical conductivity of the first p-side nitride semiconductor layer constituting part of the first light-emitting element portion. Accordingly, after the semiconductor layered structure constituting the first light-emitting element portion is formed, a process including a heating step, such as formation of an element portion other than the first light-emitting element portion, on the same substrate can be performed. The statement "the element portion other than the first light-emitting element portion" as used herein refers to, for example, a second light-emitting element portion with emission wavelengths different from emission wavelengths of the first light-emitting element portion, a light receiver portion, and a semiconductor element portion that controls lighting of the light-emitting element portion.

In the method of manufacturing a light-emitting device according to the embodiment described above, use of a protective film containing an element that functions as an n-type impurity for the nitride semiconductor as the protective film formed on the p-type nitride semiconductor layer is not limited even in the case in which a step involving such heat treatment as to grow a semiconductor layer for forming an element portion other than the first light-emitting element portion is included after formation of the layered structure of the first light-emitting element portion. Accordingly, a protective film made of $SiO_2$ or the like, which is suitable as the protective film and generally used, can be used.

The method of manufacturing a light-emitting device according to certain embodiments will be described below in detail on the basis of specific examples. The description below involves the case of manufacturing the light-emitting device including the first light-emitting element portion 100 and the second light-emitting element portion 200 shown in FIG. 1A and FIG. 1B as appropriate.

In the description below, source gases that can be used in metal organic chemical vapor deposition (MOCVD)

described as an example of a method of growing the nitride semiconductor layer are as follows.

Ga source gas: trimethylgallium (TMG) and triethylgallium (TEG)
N source gas: ammonia (NH3)
In source gas: trimethylindium (TMI)
Al source gas: trimethylaluminum (TMA)
Si source gas: monosilane (SiH$_4$)
Mg source gas: bis(cyclopentadienyl)magnesium (Cp$_2$Mg)

Layered-Structure Growth Step S1

Figure 3B:
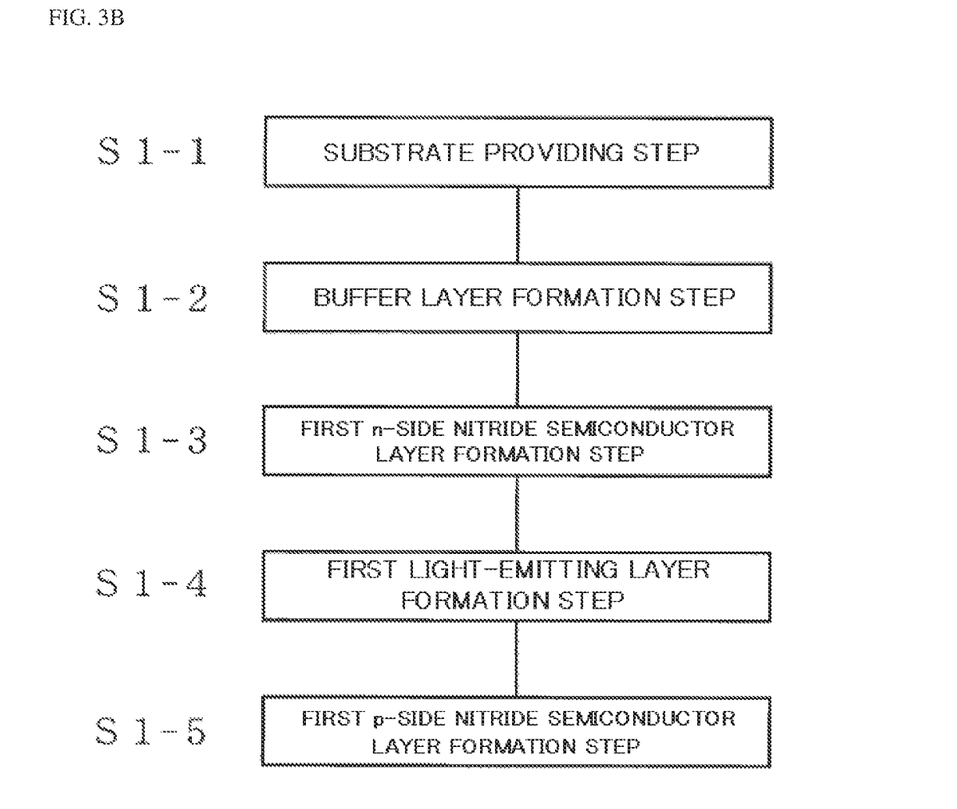
FIG. 3B is a flowchart of a layered-structure growth step in the method of manufacturing a light-emitting device according to the embodiment in the present disclosure.

For example, in the case in which the first light-emitting element portion 100 and the second light-emitting element portion 200 shown in FIG. 1A and other drawings are included, the layered-structure growth step includes, for example, a substrate providing step S1-1, a buffer layer formation step S1-2, an n-side nitride semiconductor layer formation step S1-3, a first light-emitting layer formation step S1-4, and a first p-side nitride semiconductor layer formation step S1-5 as shown in FIG. 3B.

Substrate Providing Step S1-1

In the substrate providing step, the substrate 10 on which a nitride semiconductor can be grown is provided. The substrate 10 may be, for example, a sapphire substrate, a GaN substrate, a Si substrate, a SiC substrate, or a Ga$_2$O$_3$ substrate. A substrate made of a single material or a substrate made of a plurality of materials, such as a template substrate in which a nitride semiconductor layer has been formed on a sapphire substrate, may be used for the substrate 10. In the substrate providing step, a plurality of projections are formed as appropriate on the upper surface, on which the nitride semiconductor is to be grown, by reactive ion etching (RIE) or other methods.

Buffer Layer Formation Step S1-2

Figure 2A:
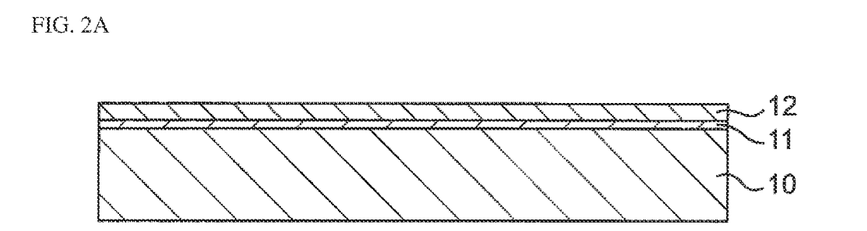
FIG. 2A is a schematic cross-sectional view for illustrating the flow of steps in a method of manufacturing a light-emitting device according to an embodiment in the present disclosure.

In the buffer layer formation step, for example, an AlGaN layer is first grown to a thickness of 20 nm at a comparatively low temperature of 500° C. on the upper surface of the provided substrate 10 as shown in FIG. 2A to form the buffer layer 11. The buffer layer formation step may be omitted in the case in which the buffer layer 11 is unnecessary.

First n-Side Nitride Semiconductor Layer Formation Step S1-3

In the first n-side nitride semiconductor layer formation step, non-doped GaN is grown to a thickness of 3.5 μm as shown in FIG. 2A to form the non-doped GaN layer 12. Next, the Si-doped GaN layer 111 is formed on the non-doped GaN layer 12. For example, the Si-doped GaN layer 111 is formed to have a thickness of 7 μm and to contain Si, which is an n-type impurity, at an impurity concentration of 5-7×10$^{18}$/cm$^3$. The non-doped GaN layer 12 and the Si-doped GaN layer 111 constitute a portion of the first n-side nitride semiconductor layer 110 in the first light-emitting element portion 100.

For example, the non-doped GaN layer 12 is formed by metal organic chemical vapor deposition at a temperature of 1,100° C. under a flow of the Ga source gas and the nitrogen source gas. For example, the Si-doped GaN layer 111 is formed by metal organic chemical vapor deposition at a temperature of 1,200° C. under a flow of the Ga source gas, the nitrogen source gas, and the Si source gas.

In the first n-side nitride semiconductor layer 110 formation step, layers that are necessary in consideration of the emission wavelengths of the first light-emitting element portion 100 and the like are formed. The first n-side nitride semiconductor layer 110 may be composed of only an n-type nitride semiconductor layer such as the Si-doped GaN layer 111.

Figure 2B:
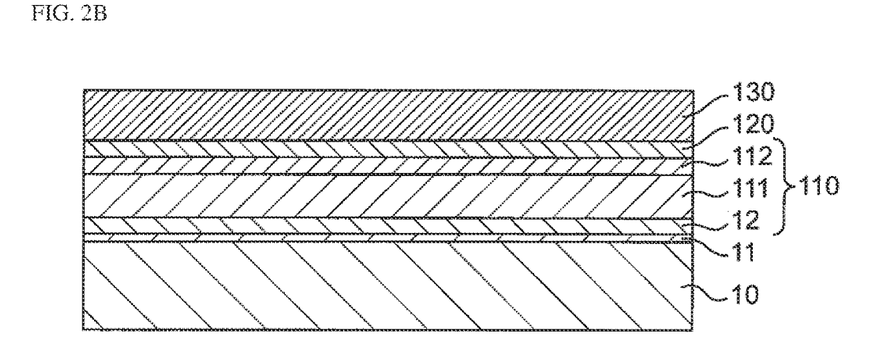
FIG. 2B is a schematic cross-sectional view for illustrating the flow of steps in the method of manufacturing a light-emitting device according to the embodiment in the present disclosure.

In the case in which the first light-emitting element portion 100 is to be configured to emit blue light, for example, the superlattice layer 112 is formed by alternately layering 20 pairs of GaN layers with a thickness of 2 nm and In$_{0.06}$Ga$_{0.94}$N layers with a thickness of 1 nm on the Si-doped GaN layer 111 as shown in FIG. 2B.

The superlattice layer 112 is formed by, for example, metal organic chemical vapor deposition by repeating 20 cycles of growth of a non-doped GaN layer to a thickness of 2 nm under a flow of the Ga source gas and the N source gas at a temperature of 840° C. and growth of a non-doped In$_{0.06}$Ga$_{0.94}$N layer to a thickness of 1 nm at a temperature of 840° C. using the In source gas added.

The first n-side nitride semiconductor layer 110 contains the lower n-type semiconductor layer. The first n-side nitride semiconductor layer 110 may contain an n-type layer other than the lower n-type semiconductor layer. The first n-side nitride semiconductor layer 110 may contain a non-doped layer. Examples of the nitride semiconductor constituting the first n-side nitride semiconductor layer 110 include GaN, InGaN, AlGaN, AlN, and AlInGaN. Examples of the n-type impurity in the first n-side nitride semiconductor layer 110 include Si and Ge.

First Light-Emitting Layer Formation Step S1-4

In the first light-emitting layer formation step, the first light-emitting layer 120 is formed on the first n-side nitride semiconductor layer 110. The first light-emitting layer (active layer) 120 is formed by, for example, alternately layering nine pairs of barrier layers with a thickness of 4.8 nm and well layers with a thickness of 3.5 nm on the superlattice layer 112. In the case in which the first light-emitting element portion 100 is configured to emit blue light, for example, barrier layers with a thickness of 4.8 nm made of GaN and well layers with a thickness of 3.5 nm made of In$_{x1}$Ga$_{1-x1}$N are alternately formed, where x1 is, for example, 0.14 to 0.15.

The first light-emitting layer (active layer) 120 is formed by, for example, metal organic chemical vapor deposition by repeating nine cycles of growth of a non-doped GaN layer to a thickness of 4.8 nm under a flow of the Ga source gas and the N source gas and growth of a non-doped In$_{0.14}$Ga$_{0.86}$N layer to a thickness of 3.5 nm using the In source gas added and finally growing a GaN barrier layer.

The first light-emitting layer 120 can be made of a nitride semiconductor. For example, the first light-emitting layer 120 can have a quantum well structure including well layers made of In$_{x1}$Ga$_{1-x1}$N. In this case, the barrier layers can be made of, for example, GaN or InGaN having a lower In content than the well layers. A single barrier layer may include a plurality of layers.

First p-Side Nitride Semiconductor Layer Formation Step S1-5

In the first p-side nitride semiconductor layer formation step, the first p-side nitride semiconductor layer 130 in the first light-emitting element portion 100 is formed.

The first p-side nitride semiconductor layer 130 is formed by, for example, growing the Mg-doped AlGaN layer 131, the non-doped GaN layer 132, and the Mg-doped GaN layer 133 on the first light-emitting layer (active layer) 120 in this order. In the case in which the first light-emitting element portion 100 is configured to emit blue light, the Mg-doped AlGaN layer 131 is formed by, for example, growing Al$_{0.17}$Ga$_{0.83}$N doped with Mg to a thickness of 10 nm. The non-doped GaN layer 132 is formed by, for example, growing non-doped GaN to a thickness of 70 nm. The Mg-doped GaN layer 133 is formed by, for example, growing GaN doped with Mg to a thickness of 20 nm.

The Mg-doped AlGaN layer 131 is formed by, for example, growing $Al_{0.17}Ga_{0.83}N$ doped with Mg at a temperature of 840° C. using the Al source gas, the Ga source gas, the N source gas, and the Mg source gas. The non-doped GaN layer 132 is formed by growing GaN to a thickness of 70 nm at a temperature of 900° C. using the Ga source gas and the N source gas without the flow of the Al source gas and the Mg source gas. The Mg-doped GaN layer 133 is formed by growing GaN doped with Mg to a thickness of 20 nm using the Ga source gas, the N source gas, and the Mg source gas.

The first p-side nitride semiconductor layer 130 contains one or more p-type layers. The first p-side nitride semiconductor layer 130 may contain a non-doped layer. Examples of the nitride semiconductor constituting the first p-side nitride semiconductor layer 130 include GaN, InGaN, AlGaN, AlN, and AlInGaN. Examples of the p-type impurity in the first p-side nitride semiconductor layer 130 include Mg.

Upper n-Type Semiconductor Layer Growth Step S2

In the upper n-type semiconductor layer growth step, the upper n-type semiconductor layer 150 is grown on the first p-side nitride semiconductor layer 130, that is, on the Mg-doped GaN layer 133.

Figure 2C:
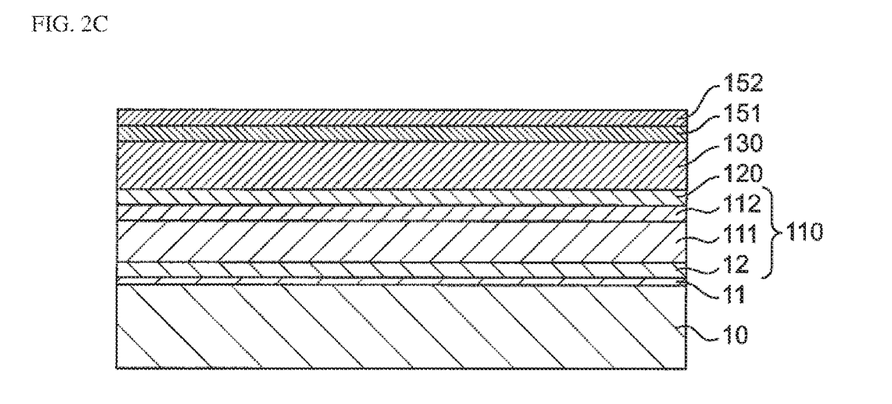
FIG. 2C is a schematic cross-sectional view for illustrating the flow of steps in the method of manufacturing a light-emitting device according to the embodiment in the present disclosure.

The upper n-type semiconductor layer 150 may include a plurality of layers. The upper n-type semiconductor layer 150 is formed by, for example, growing the Si-doped GaN layer 151 on the Mg-doped GaN layer 133 and growing the Si-doped GaN layer 152 on the Si-doped GaN layer 151 as shown in FIG. 2C. For example, the Si-doped GaN layer 151 may be formed by growing n-type GaN doped with Si, which is an n-type impurity, at a comparatively high concentration of $8\times10^{19}$ to $8\times10^{20}/cm^3$ to a thickness of 30 nm. For example, the Si-doped GaN layer 152 may be formed by growing n-type GaN doped with Si, which is an n-type impurity, at a concentration of $5\text{-}7\times10^{18}/cm^3$ lower than the concentration in the Si-doped GaN layer 151 to a thickness of 0.1 µm.

For example, the Si-doped GaN layer 151 may be formed by metal organic chemical vapor deposition by growing n-type GaN doped with Si, which is an n-type impurity, at a comparatively high concentration of $8\times10^{19}$ to $8\times10^{20}/cm^3$ to a thickness of 30 nm under a flow of the Ga source gas, the N source gas, and the Si source gas at a temperature of 900° C. The Si-doped GaN layer 152 may be formed after the Si-doped GaN layer 151 by adjusting the flow rate of the Si source gas to, for example, grow n-type GaN doped with Si, which is an n-type impurity, at a concentration of $5\text{-}7\times10^{18}/cm^3$ to a thickness of 0.1 µm.

The upper n-type semiconductor layer 150 forms a tunnel junction with the first p-side nitride semiconductor layer 130. That is, each layer is grown such that a tunnel junction is formed between the first p-side nitride semiconductor layer 130 and the upper n-type semiconductor layer 150. To form the tunnel junction, the hole carrier density in the uppermost layer of the first p-side nitride semiconductor layer 130 is allowed to be high, and the electron carrier density in the lowermost layer of the upper n-type semiconductor layer 150 is allowed to be high. To achieve this constitution, the uppermost layer of the first p-side nitride semiconductor layer 130 is allowed to have a first concentration of the p-type impurity, and the lowermost layer of the upper n-type semiconductor layer 150 is allowed to have a second concentration of the n-type impurity. The first concentration and the second concentration are such concentrations as to allow the first p-side nitride semiconductor layer 130 to form a tunnel junction with the upper n-type semiconductor layer 150. For example, the first concentration can be $1\times10^{20}$ to $8\times10^{20}/cm^3$. For example, the second concentration can be $8\times10^{19}$ to $8\times10^{20}/cm^3$. For example, the p-type impurity concentration in the Mg-doped GaN layer 133 serving as the uppermost layer of the first p-side nitride semiconductor layer 130 can be $1\times10^{20}$ to $8\times10^{20}/cm^3$. For example, the n-type impurity concentration in the Si-doped GaN layer 151 serving as the lowermost layer of the upper n-type semiconductor layer 150 can be $8\times10^{19}$ to $8\times10^{20}/cm^3$. The n-type impurity concentration in the lowermost layer of the upper n-type semiconductor layer 150 is preferably higher than the n-type impurity concentration in the lower n-type semiconductor layer used for the contact layer of the n-side electrode 170. This constitution facilitates formation of the tunnel junction.

The thickness of the upper n-type semiconductor layer 150 is preferably 500 nm or less. The upper n-type semiconductor layer 150 contains a comparatively high concentration of an n-type impurity to form the tunnel junction, and it is preferable that the growth temperature be comparatively high to reduce deterioration of crystallinity due to addition of the impurity. On the other hand, the higher the growth temperature is, the higher the risk of deterioration of other layers that has already been formed, in particular the first light-emitting layer 120, becomes. Hence, the thickness of the upper n-type semiconductor layer 150 is preferably thin, such as about 500 nm or less, so that the risk of deterioration of the first light-emitting layer 120 can be reduced. An example of the lower limit of the thickness of the upper n-type semiconductor layer 150 is 3 nm. The upper n-type semiconductor layer 150 may be formed using an apparatus that can form a film at comparatively low temperatures, such as a sputtering apparatus or a molecular beam epitaxy (MBE) apparatus, instead of using an apparatus for growth at high temperatures, such as an MOCVD apparatus. In the case of formation with a sputtering apparatus or the like at comparatively low temperatures, the thickness of the upper n-type semiconductor layer 150 may be greater than 500 nm.

In the case in which the upper n-type semiconductor layer 150 includes a plurality of layers, the n-type impurity concentration is preferably highest in the lowermost layer and lower in layers above the lowermost layer than the concentration in the lowermost layer. Such a multilayer structure allows the thickness of the high-concentration doped layer required for the tunnel junction to be reduced, so that the crystallinity of the upper n-type semiconductor layer 150 can be improved. The thickness of the lowermost layer is preferably smaller than the thicknesses of the low-concentration layers disposed above the lowermost layer. The crystallinity of the upper n-type semiconductor layer 150 can be further improved.

The upper n-type semiconductor layer 150 can be made of a nitride semiconductor. Among nitride semiconductors, GaN is suitable in order to improve the crystallinity, so that an n-type GaN layer is preferably formed as the upper n-type semiconductor layer 150. If the upper n-type semiconductor layer 150 is made of a nitride semiconductor, the electron carrier density in the upper n-type semiconductor layer 150 can increase due to diffusion of the n-type impurity from the protective film described later. The upper n-type semiconductor layer 150 can be composed of only the n-type layer. Examples of the n-type impurity in the upper n-type semiconductor layer 150 include Si and Ge.

A washing step may be included between the first p-side nitride semiconductor layer formation step and the upper n-type semiconductor layer formation step. For example, the substrate 10 is disposed in the chamber of a reactor, such as an MOCVD apparatus, for forming a semiconductor layer, a semiconductor layer lamination step including the first p-side nitride semiconductor layer formation step is performed, and a wafer composed of the substrate 10 and the semiconductor layers is temporarily removed from the MOCVD apparatus. After that, the washing step is performed, the wafer is returned to the chamber of the reactor, and the upper n-type semiconductor layer formation step is performed. Performing the washing step improved the crystallinity of the upper n-type semiconductor layer 150 compared with the case in which the first p-side nitride semiconductor layer 130 and the upper n-type semiconductor layer 150 are successively grown without the washing step. The reason such results are obtained is not clear. Examples of conceivable reasons include that the electron carrier density in the upper n-type semiconductor layer 150 to be grown next increases because the memory effect of Mg is eliminated due to the temporary removal from the chamber or that increase in voltage due to the tunnel junction is improved by removing impurities such as Mg or O on the outer layer of the first p-side nitride semiconductor layer 130 by washing. On the basis of the latter reason, the washing step is only required to be capable of removing impurities on the outer layer of the first p-side nitride semiconductor layer 130. Examples of a cleansing liquid include hydrofluoric acid and hydrochloric acid.

A first light-emitting element portion shaping step can be included after the formation of the Si-doped GaN layer 152 and before the protective film formation step.

First Light-Emitting Element Portion Shaping Step

In the first light-emitting element portion shaping step, the surface of the first n-side nitride semiconductor layer 110 is exposed by removing the upper n-type semiconductor layer 150, the first p-side nitride semiconductor layer 130, and the first light-emitting layer 120 except for the first light-emitting element portion including a portion of the upper n-type semiconductor layer 150 and portions of the first p-side nitride semiconductor layer 130 and the first light-emitting layer 120 under the portion of the upper n-type semiconductor layer 150.

Figure 2D:
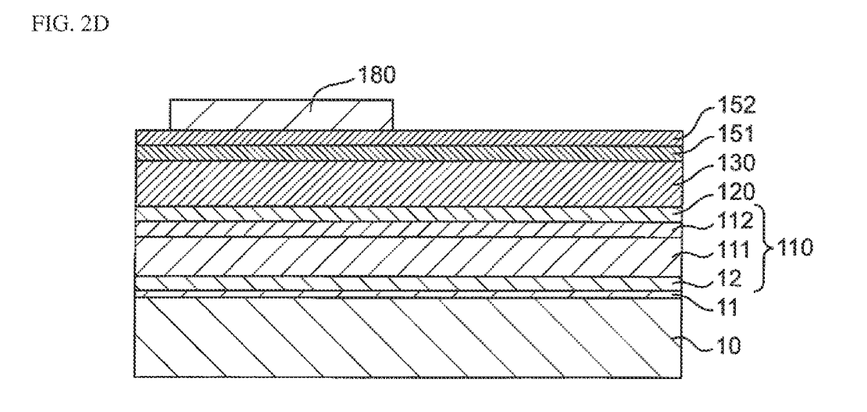
FIG. 2D is a schematic cross-sectional view for illustrating the flow of steps in the method of manufacturing a light-emitting device according to the embodiment in the present disclosure.
Figure 2E:
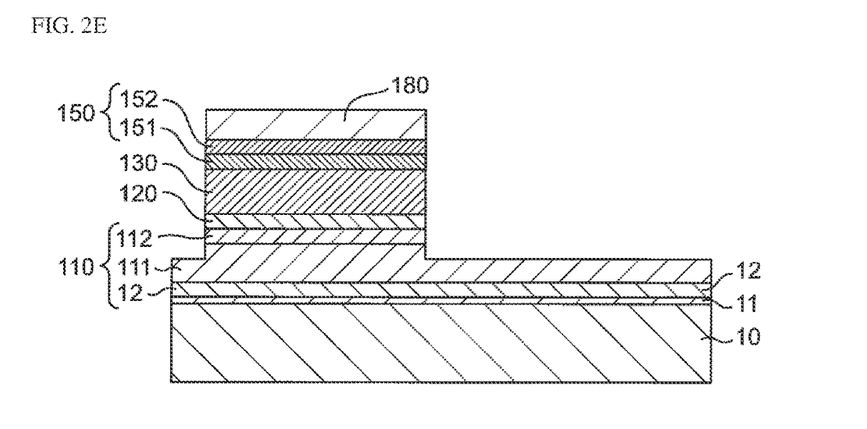
FIG. 2E is a schematic cross-sectional view for illustrating the flow of steps in the method of manufacturing a light-emitting device according to the embodiment in the present disclosure.
Figure 2F:
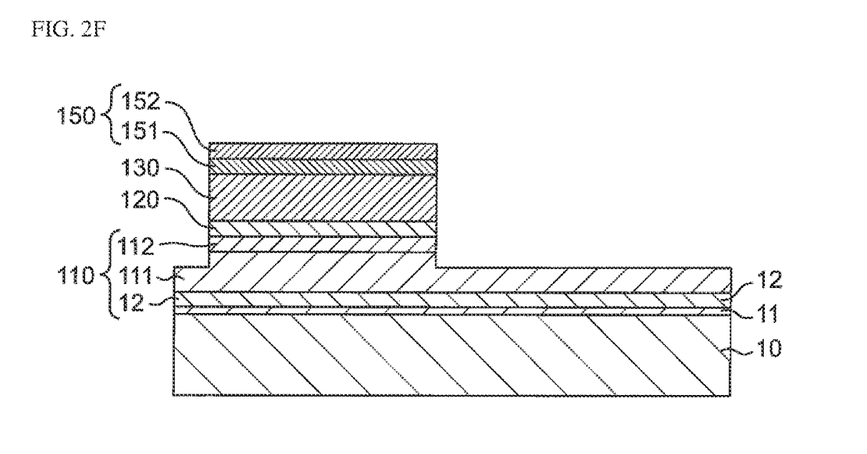
FIG. 2F is a schematic cross-sectional view for illustrating the flow of steps in the method of manufacturing a light-emitting device according to the embodiment in the present disclosure.

Specifically, a mask 180 is formed on the upper surface of the upper n-type semiconductor layer 150 in a region (hereinafter referred to as a first region) in which the first light-emitting element portion is to be formed, as shown in FIG. 2D. The upper n-type semiconductor layer 150, the first p-side nitride semiconductor layer 130, and the first light-emitting layer 120 in a region (hereinafter referred to as a second region) other than the first region are then removed by, for example, reactive ion etching as shown in FIG. 2E. This operation forms the semiconductor layered structure for the first light-emitting element portion and exposes the surface of the first n-side nitride semiconductor layer 110 in the second region. After that, the mask 180 is removed (FIG. 2F). In the case of reactive ion etching, the mask 180 is formed by, for example, patterning a photoresist film by a general photolithography technique. The first n-side nitride semiconductor layer 110 may be partially removed as shown in FIG. 2E. The surface of the Si-doped GaN layer 111 is exposed in FIG. 2E. The surface of the lower n-type semiconductor layer in the first n-side nitride semiconductor layer 110 may be exposed as described above. This operation allows the n-side electrode formed on the lower n-type semiconductor layer to function as an electrode shared between the first light-emitting element portion 100 and the second light-emitting element portion 200 in the case in which the second light-emitting element portion 200 described later is formed. The non-doped GaN layer 12 or the substrate 10 may be exposed by the removal in this step. In this case, an n-side electrode for the second light-emitting element portion 200 is formed separately from an n-side electrode for the first light-emitting element portion 100.

Protective Film Formation Step S3

Figure 2G:
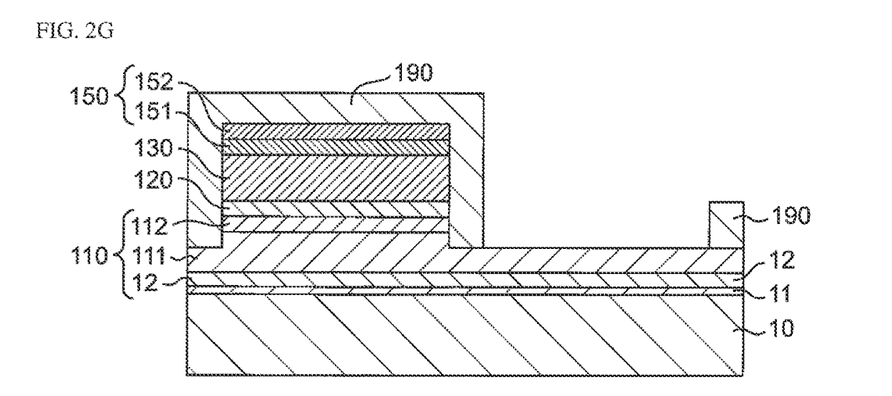
FIG. 2G is a schematic cross-sectional view for illustrating the flow of steps in the method of manufacturing a light-emitting device according to the embodiment in the present disclosure.

In the protective film formation step, a protective film 190 is formed to cover the first light-emitting element portion 100. In the protective film formation step, for example, the protective film 190 is formed on a portion of the second region other than a region in which the second light-emitting element portion 200 is to be formed as shown in FIG. 2G. In other words, the protective film 190 is formed to cover the first light-emitting element portion 100 such that a portion, in which the second light-emitting element portion is to be formed, of the exposed surface of the first n-side nitride semiconductor layer 110 is exposed. The protective film 190 is made of a material containing an n-type impurity that imparts n-type electrical conductivity to a nitride semiconductor. Examples of such an n-type impurity include silicon (Si), and the protective film 190 can be made of a material containing Si. Examples of the material containing Si include silicon oxide and silicon nitride. For example, $SiO_2$, $Si_3N_4$, or SiON can be used for the material of the protective film 190. For example, a film of silicon oxide such as $SiO_2$ can be formed as the protective film 190. The region to be covered with the protective film 190 can be determined according to the intended use. The protective film 190 covers at least the upper surface of the upper n-type semiconductor layer 150.

Heating Step S4

Figure 3C:
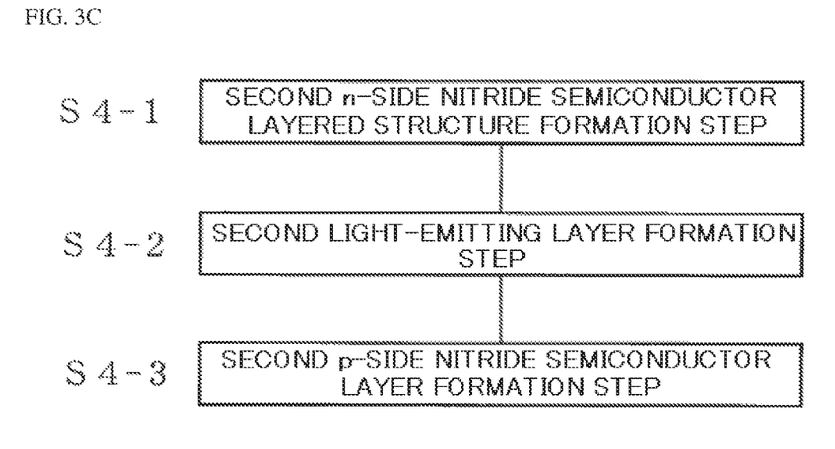
FIG. 3C is a flowchart of a semiconductor layered structure formation step for a second light-emitting element portion, which is a specific example of a heating step in the method of manufacturing a light-emitting device according to the embodiment in the present disclosure.

In the heating step, the first light-emitting element portion 100, in particular at least the upper n-type semiconductor layer 150 of the first light-emitting element portion 100, and the protective film 190 are heated. In the method of manufacturing a light-emitting device including the first light-emitting element portion 100 and the second light-emitting element portion 200, examples of the heating step include a step of growing a semiconductor for forming the semiconductor layered structure constituting the second light-emitting element portion 200 as shown in FIG. 3C.

Semiconductor Layered-Structure Growth Step for Second Light-Emitting Element Portion 200

Second n-Side Nitride Semiconductor Layered Structure Formation Step S4-1

Figure 2H:
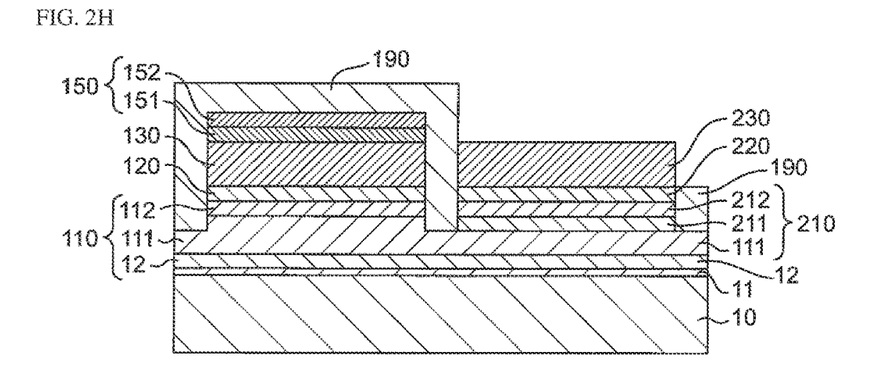
FIG. 2H is a schematic cross-sectional view for illustrating the flow of steps in the method of manufacturing a light-emitting device according to the embodiment in the present disclosure.

In this step, layers that are necessary in consideration of the emission wavelengths of the second light-emitting element portion 200 and the like are formed on the first n-side nitride semiconductor layer 110 exposed from the protective film 190. That is, at least the second light-emitting layer 220 and the second p-side nitride semiconductor layer 230 are grown over the exposed surface of the first n-side nitride semiconductor layer 110 as shown in FIG. 2H. The Si-doped GaN layer 211 and the superlattice layer 212 are first grown on the exposed surface of the first n-side nitride semiconductor layer 110 in FIG. 2H. The Si-doped GaN layer 211 and the superlattice layer 212 constitute the second n-side nitride semiconductor layer 210 together with the non-doped GaN layer 12 and the Si-doped GaN layer 111. The portion shared with the first n-side nitride semiconductor layer 110 alone may constitute the second n-side nitride semiconductor layer 210 without formation of new layers for the second n-side nitride semiconductor layer 210. To enhance the crystallinity of the second light-emitting layer 220, it is preferable to form new layers such as the Si-doped GaN layer 211 and the superlattice layer 212 for the second n-side nitride semiconductor layer 210. This is because the condition of the exposed surface of the first n-side nitride semiconductor layer 110 may not be good due to the protective film formation step.

In the case in which the second light-emitting element portion 200 is to be configured to emit green light, for example, the superlattice layer 212 is formed by alternately layering 30 pairs of GaN layers with a thickness of 3 nm and $In_{0.06}Ga_{0.94}N$ layers with a thickness of 1.5 nm on the exposed first n-side nitride semiconductor layer 110.

The superlattice layer 212 is formed by, for example, metal organic chemical vapor deposition by repeating 30 cycles of growth of a non-doped GaN layer to a thickness of 1.5 nm under a flow of the Ga source gas and the N source gas at a temperature of 840° C. and growth of a non-doped $In_{0.06}Ga_{0.94}N$ layer to a thickness of 1.5 nm at a temperature of 840° C. using the In source gas added.

The whole second n-side nitride semiconductor layer 210 in the second light-emitting element portion 200 is formed through the n-side nitride semiconductor layer formation step and the layered structure formation step for the second n-side nitride semiconductor layer 210 described above.

The second n-side nitride semiconductor layer 210 contains one or more n-type layers. The second n-side nitride semiconductor layer 210 may contain a non-doped layer. Examples of the nitride semiconductor constituting the second n-side nitride semiconductor layer 210 include GaN, InGaN, AlGaN, AlN, and AlInGaN. Examples of the n-type impurity in the second n-side nitride semiconductor layer 210 include Si and Ge.

Second Light-Emitting Layer Formation Step S4-2

In this step, the second light-emitting layer 220 is formed on the second n-side nitride semiconductor layer 210. A layer having a composition different from the composition of the first light-emitting layer 120 is formed as the second light-emitting layer 220. The second light-emitting layer (active layer) 220 is formed by, for example, alternately layering nine pairs of barrier layers with a thickness of 15 nm and well layers with a thickness of 3 nm on the superlattice layer 212.

In the case in which the second light-emitting element portion 200 is configured to emit green light, for example, barrier layers with a thickness of 15 nm made of GaN and well layers with a thickness of 3 nm made of $In_{x2}Ga_{1-x2}N$ are alternately formed, where x2 is, for example, 0.19 to 0.20.

The second light-emitting layer (active layer) 220 is formed by, for example, metal organic chemical vapor deposition by repeating nine cycles of growth of a non-doped GaN layer to a thickness of 15 nm under a flow of the Ga source gas and the N source gas and growth of a non-doped $In_{0.2}Ga_{0.8}N$ layer to a thickness of 3 nm using the In source gas added and finally growing a GaN barrier layer.

The second light-emitting layer 220 can be made of a nitride semiconductor. For example, the second light-emitting layer 220 can have a quantum well structure including well layers made of $In_{x2}Ga_{1-x2}N$. In this case, the barrier layers can be made of, for example, GaN or InGaN having a lower In content than the well layers. A single barrier layer may include a plurality of layers.

By forming the first light-emitting layer 120 and the second light-emitting layer 220 with different compositions, a single light-emitting device can produce different colors of light. It is preferable that the first light-emitting layer 120 can emit light with wavelengths shorter than wavelengths of light emitted from the second light-emitting layer 220 that is grown later. This is because the shorter the emission wavelength is, the higher the In content tends to be in the nitride semiconductor light-emitting layer. That is, a layer with a higher In content is unlikely to be damaged by heating. For example, in the case in which the well layers of the first light-emitting layer 120 are made of $In_{x1}Ga_{1-x1}N$ and in which the well layers of the second light-emitting layer 220 are made of $In_{x2}Ga_{1-x2}N$, x1 is preferably smaller than x2. If the second light-emitting layer 220 and the first light-emitting layer 120 have the same composition, the first light-emitting element portion 100 and the second light-emitting element portion 200 can produce light having the same color.

Second p-Side Nitride Semiconductor Layer Formation Step S4-3

In this step, the second p-side nitride semiconductor layer 230 in the second light-emitting element portion 200 is formed.

The second p-side nitride semiconductor layer 230 is formed by, for example, growing the Mg-doped AlGaN layer 231, the non-doped GaN layer 232, and the Mg-doped GaN layer 233 on the second light-emitting layer (active layer) 220 in this order. The Mg-doped AlGaN layer 231 is formed by, for example, growing $Al_{0.17}Ga_{0.83}N$ doped with Mg to a thickness of 10 nm. The non-doped GaN layer 232 is formed by, for example, growing non-doped GaN to a thickness of 70 nm. The Mg-doped GaN layer 233 is formed by growing GaN doped with Mg to a thickness of 20 nm.

The Mg-doped AlGaN layer 231 is formed by, for example, metal organic chemical vapor deposition by growing $Al_{0.17}Ga_{0.83}N$ doped with Mg at a temperature of 840° C. using the Al source gas, the Ga source gas, the N source gas, and the Mg source gas. The non-doped GaN layer 232 is formed by growing GaN to a thickness of 70 nm at a temperature of 900° C. using the Ga source gas and the N source gas without the flow of the Al source gas and the Mg source gas. The Mg-doped GaN layer 233 is formed by growing GaN doped with Mg to a thickness of 20 nm using the Ga source gas, the N source gas, and the Mg source gas.

The second p-side nitride semiconductor layer 230 contains one or more p-type layers. The second p-side nitride semiconductor layer 230 may contain a non-doped layer. Examples of the nitride semiconductor constituting the second p-side nitride semiconductor layer 230 include GaN, InGaN, AlGaN, AlN, and AlInGaN. Examples of the p-type impurity in the second p-side nitride semiconductor layer 230 include Mg and Zn.

In the method of manufacturing a light-emitting device including the first light-emitting element portion 100 and the second light-emitting element portion 200, for example, the first light-emitting element portion 100 is repeatedly heated if the second light-emitting element portion 200 is formed after the first light-emitting element portion 100 is formed as described above. Such heating may diffuse the n-type impurity contained in the protective film 190 into the semiconductor layers constituting the first light-emitting element portion 100. In the present embodiment, diffusion of the n-type impurity is not likely to greatly change the characteristics of the semiconductor layers constituting the first light-emitting element portion 100 because the upper n-type semiconductor layer 150 is disposed between the protective film 190 and the first p-side nitride semiconductor layer 130 as shown in FIG. 2H. Examples of heating conditions under which the n-type impurity contained in the protective film 190 can be diffused include heating at 600° C. or higher for 40 minutes or more. To reduce the effect on the semiconductor layers constituting the first light-emitting element portion 100, the condition of heating the first light-emitting element portion 100 is preferably a peak temperature of 1,000° C. or lower. The condition of heating the first light-emitting element portion 100 is preferably a total time until the temperature reaches 950° C. or higher of 60 minutes or less.

Protective Film Removal Step S5

Figure 2I:
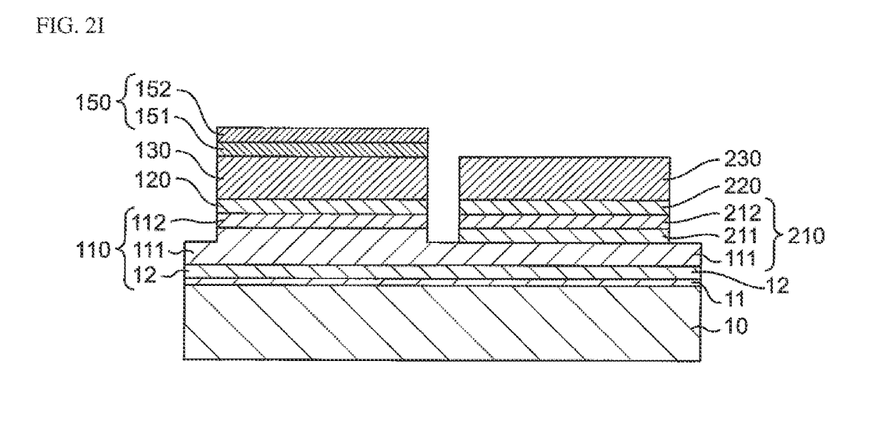
FIG. 2I is a schematic cross-sectional view for illustrating the flow of steps in the method of manufacturing a light-emitting device according to the embodiment in the present disclosure.

In the protective film removal step, the protective film 190 is removed as shown in FIG. 2I so that the first p-side electrode 160 and the second p-side electrode 260 can be formed. It is sufficient to remove a portion of the protective film 190 formed on the surface of the upper n-type semiconductor layer 150 so that at least the first p-side electrode 160 of the first light-emitting element portion 100 can be formed. That is, it is sufficient to expose a portion of the upper n-type semiconductor layer 150 by removing at least the portion of the protective film 190 in the protective film removal step. However, the entire surface (upper surface) of the upper n-type semiconductor layer 150 may be exposed. Alternatively, for example, in the case in which the n-side electrode 170 shared between the first light-emitting element portion 100 and the second light-emitting element portion 200 shown in FIG. 1A is formed on the lower n-type semiconductor layer (Si-doped GaN layer 111), a portion of the lower n-type semiconductor layer on which the n-side electrode 170 is to be formed may be exposed by removing at least a portion of the protective film 190 formed on the lower n-type semiconductor layer in the second region described above in the protective film removal step. The entire protective film 190 may be removed as shown in FIG. 2I. The protective film 190 may be partially left so that the protective film 190 is used for a protective film for a resulting light-emitting device.

Electrode Formation Step S6

Figure 2J:
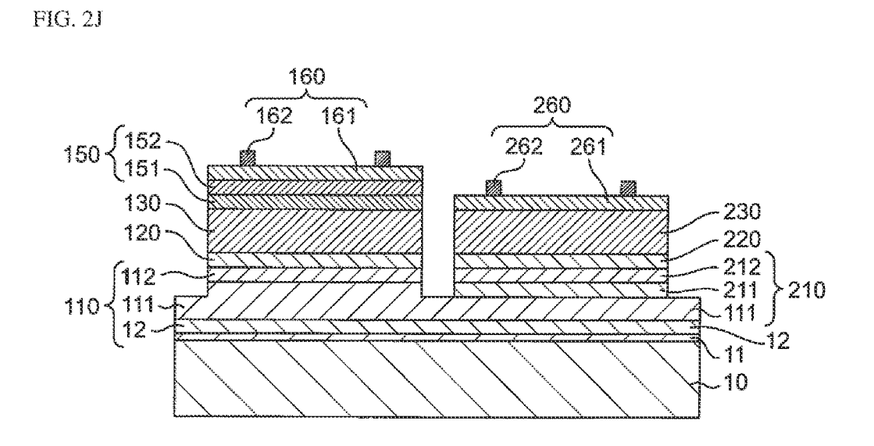
FIG. 2J is a schematic cross-sectional view for illustrating the flow of steps in the method of manufacturing a light-emitting device according to the embodiment in the present disclosure.

In the electrode formation step, after the protective film 190 is removed, the first p-side electrode 160 is formed on the exposed surface of the upper n-type semiconductor layer 150 as shown in FIG. 2J. In the electrode formation step, the first p-side electrode 160 of the first light-emitting element portion 100 and the second p-side electrode 260 of the second light-emitting element portion 200 may be formed at the same time in the same step. With the first p-side electrode 160 spaced apart from the second p-side electrode 260, the first light-emitting element portion 100 and the second light-emitting element portion 200 can be separately operated. In the case in which the first light-emitting element portion 100 and the second light-emitting element portion 200 are to be operated at the same time, the first p-side electrode 160 may be connected to the second p-side electrode 260.

The first p-side electrode 160 includes the first light-transmissive electrode 161 and the first pad electrode 162. The second p-side electrode 260 includes the second light-transmissive electrode 261 and the second pad electrode 262. For example, the first light-transmissive electrode 161 and the second light-transmissive electrode 261 are formed by forming light-transmissive electrically conductive films with a thickness of 60 nm made of ITO by a method such as sputtering or vapor deposition. For example, each of the first pad electrode 162 and the second pad electrode 262 is formed by forming a Ti layer with a thickness of 1.5 nm, a Rh layer with a thickness of 200 nm, and a Au layer with a thickness of 500 nm by a method such as sputtering or vapor deposition from the side of the first light-transmissive electrode 161 and the second light-transmissive electrode 261. Each of the first pad electrode 162 and the second pad electrode 262 may include a pad portion connected to a wire or the like and branch portions having a width smaller than the width of the pad portion and extending from the pad portion. The pad portion of the first pad electrode 162 and the pad portion of the second pad electrode 262 can be disposed on the same side of the light-emitting device in a top view as shown in FIG. 1A.

The n-side electrode 170 is formed at a position that is located on the lower n-type semiconductor layer (Si-doped GaN layer 111) exposed by removing the protective film 190 and is away from the first light-emitting element portion 100 and the second light-emitting element portion 200. For example, the n-side electrode 170 contains elements such as Ti, Al, Pt, and Au and is formed by sputtering or vapor deposition. The n-side electrode 170 is electrically connected to the first n-side nitride semiconductor layer 110 and the second n-side nitride semiconductor layer 210. An n-side electrode for the first light-emitting element portion 100 may be formed separately from an n-side electrode for the second light-emitting element portion 200. To miniaturize the light-emitting device, formation of the n-side electrode 170 shared between the first light-emitting element portion 100 and the second light-emitting element portion 200 is preferred to formation of separate n-side electrodes. The n-side electrode does not necessarily have to be in contact with the first n-side nitride semiconductor layer 110 and the second n-side nitride semiconductor layer 210. For example, in the case in which the substrate 10 is an electrically conductive substrate, the n-side electrode can be formed on the back surface of the substrate 10.

The method of manufacturing a light-emitting device according to the embodiment described above includes the heating step such as a step of growing the semiconductor layered structure of the second light-emitting element portion 200 after the semiconductor layered structure of the first light-emitting element portion 100 is formed. If the first p-side nitride semiconductor layer 130 is in contact with the protective film 190, the p-type electrical conductivity of the first p-side nitride semiconductor layer 130 may be reduced due to diffusion of the n-type impurity contained in the protective film 190 into the first p-side nitride semiconductor layer 130 as described above.

However, in the manufacturing method of the present embodiment, in the semiconductor layered structure of the first light-emitting element portion 100, the upper n-type semiconductor layer 150 is formed on the first p-side nitride semiconductor layer 130, and the protective film 190 is formed with the upper n-type semiconductor layer 150 therebetween. This structure can reduce diffusion of the n-type impurity contained in the protective film 190 into the first p-side nitride semiconductor layer 130. Accordingly, by the manufacturing method of the present embodiment, reduction in the p-type electrical conductivity of the first p-side nitride semiconductor layer 130 can be inhibited even in the case in which the first light-emitting element portion 100 is exposed to high temperatures in the subsequent heating step.

The invention claimed is:
1. A light-emitting device comprising:
 a first light-emitting element portion comprising:
  an n-side nitride semiconductor layer,
  a first light-emitting layer over the n-side nitride semiconductor layer, and
  a first p-side nitride semiconductor layer over the first light-emitting layer;
 a second light-emitting element portion comprising:
  a second light-emitting layer over the n-side nitride semiconductor layer, and
  a second p-side nitride semiconductor layer over the second light-emitting layer;

an n-side electrode connected to the n-side nitride semiconductor layer;
a first p-side electrode disposed over the first p-side nitride semiconductor layer via an upper n-type semiconductor layer; and
a second p-side electrode connected to the second p-side nitride semiconductor layer;
wherein the first p-side nitride semiconductor layer and the upper n-type semiconductor layer form a tunnel junction.

2. The light-emitting device according to claim 1, wherein:
a composition of the second light-emitting layer is different from a composition of the first light-emitting layer.

3. The light-emitting device according to claim 1, wherein:
the upper n-type semiconductor layer is an n-type GaN layer.

4. The light-emitting device according to claim 1, wherein:
the first light-emitting layer has a quantum well structure including well layers made of $In_{x1}Ga_{1-x1}N$.

5. The light-emitting device according to claim 4, wherein:
x1 is in a range of 0.14 to 0.15.

6. The light-emitting device according to claim 4, wherein:
the second light-emitting layer has a quantum well structure including well layers made of $In_{x2}Ga_{1-x2}N$.

7. The light-emitting device according to claim 6, wherein:
x2 is in a range of 0.19 to 0.20.

8. The light-emitting device according to claim 6, wherein:
x1 is smaller than x2.

9. The light-emitting device according to claim 1, wherein:
the first p-side nitride semiconductor layer includes a Mg-doped GaN layer.

10. The light-emitting device according to claim 9, wherein:
the first p-side nitride semiconductor layer further includes a non-doped GaN layer disposed between the Mg-doped GaN layer and the first light-emitting layer, and a Mg-doped AlGaN layer disposed between the non-doped GaN layer and the first light-emitting layer.

11. The light-emitting device according to claim 9, wherein:
the upper n-type semiconductor layer includes a first upper n-type semiconductor layer disposed in contact with the Mg-doped GaN layer and a second upper n-type semiconductor layer disposed on the first upper n-type semiconductor layer.

12. The light-emitting device according to claim 11, wherein:
the first upper n-type semiconductor layer is a Si-doped GaN layer, and
the second upper n-type semiconductor layer is a Si-doped GaN layer.

13. The light-emitting device according to claim 1, wherein:
an uppermost layer of the first p-side nitride semiconductor layer has a p-type impurity concentration of $1\times10^{20}$ to $8\times10^{20}/cm^3$, and
a lowermost layer of the upper n-type semiconductor layer has an n-type impurity concentration of $8\times10^{19}$ to $8\times10^{20}/cm^3$.

14. The light-emitting device according to claim 13, wherein:
the n-type impurity concentration in the lowermost layer of the upper n-type semiconductor layer is higher than an n-type impurity concentration in the n-side nitride semiconductor layer.

15. The light-emitting device according to claim 1, wherein:
the upper n-type semiconductor layer has a thickness of 500 nm or less.

* * * * *